United States Patent
Chen et al.

(10) Patent No.: US 9,013,910 B2
(45) Date of Patent: Apr. 21, 2015

(54) ANTIFUSE OTP MEMORY CELL WITH PERFORMANCE IMPROVEMENT PREVENTION AND OPERATING METHOD OF MEMORY

(71) Applicant: eMemory Technology Inc., Hsinchu (TW)

(72) Inventors: Chin-Yi Chen, New Taipei (TW); Lun-Chun Chen, Yilan County (TW); Yueh-Chia Wen, Taoyuan County (TW); Meng-Yi Wu, Hsinchu County (TW); Hsin-Ming Chen, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 14/101,367

(22) Filed: Dec. 10, 2013

(65) Prior Publication Data

US 2014/0098591 A1    Apr. 10, 2014

Related U.S. Application Data

(63) Continuation-in-part of application No. 13/366,370, filed on Feb. 6, 2012, now Pat. No. 8,638,589, which is a continuation-in-part of application No. 12/633,780, filed on Dec. 8, 2009, now Pat. No. 8,174,063.

(60) Provisional application No. 61/230,099, filed on Jul. 30, 2009, provisional application No. 61/857,703, filed on Jul. 24, 2013.

(51) Int. Cl.
*G11C 17/00*    (2006.01)
*G11C 17/16*    (2006.01)
*H01L 27/112*   (2006.01)
*G11C 17/18*    (2006.01)
*H01L 23/525*   (2006.01)

(52) U.S. Cl.
CPC .......... *G11C 17/16* (2013.01); *H01L 27/11206* (2013.01); *H01L 23/5252* (2013.01); *G11C 17/18* (2013.01)

(58) Field of Classification Search
USPC ........................................... 365/96
See application file for complete search history.

(56) References Cited

U.S. PATENT DOCUMENTS

| | | | |
|---|---|---|---|
| 4,525,145 A | 6/1985 | Scheicher et al. | |
| 6,956,258 B2 * | 10/2005 | Peng | 257/298 |
| 7,227,234 B2 | 6/2007 | Roizin et al. | |
| 7,294,888 B1 | 11/2007 | Paak et al. | |
| 7,456,465 B2 | 11/2008 | Prinz et al. | |
| 7,532,496 B1 * | 5/2009 | Bu | 365/94 |
| 7,623,368 B2 | 11/2009 | Luan | |

(Continued)

*Primary Examiner* — Son Mai
(74) *Attorney, Agent, or Firm* — Jianq Chyun IP Office

(57) ABSTRACT

Provided is an OTP memory cell including a first antifuse unit, a second antifuse unit, a select transistor, and a well region. The first and the second antifuse unit respectively include an antifuse layer and an antifuse gate disposed on a substrate in sequence. The select transistor includes a select gate, a gate dielectric layer, a first doped region, and a second doped region. The select gate is disposed on the substrate. The gate dielectric layer is disposed between the select gate and the substrate. The first and the second doped region are respectively disposed in the substrate at two sides of the select gate, wherein the second doped region is disposed in the substrate at the periphery of the first and the second antifuse unit. The well region is disposed in the substrate below the first and the second antifuse unit and is connected to the second doped region.

17 Claims, 11 Drawing Sheets

(56) References Cited

U.S. PATENT DOCUMENTS

| | | |
|---|---|---|
| 7,811,886 B2 | 10/2010 | Winstead et al. |
| 8,031,506 B2 | 10/2011 | Schmitt et al. |
| 8,283,751 B2 * | 10/2012 | Kurjanowicz ................. 257/530 |
| 8,344,445 B2 * | 1/2013 | Lu et al. ........................ 257/324 |
| 2006/0008992 A1 | 1/2006 | Shukuri |
| 2008/0188052 A1 | 8/2008 | Winstead et al. |
| 2009/0085127 A1 | 4/2009 | Liu et al. |
| 2010/0244120 A1 | 9/2010 | Kang et al. |

* cited by examiner

ANTIFUSE OTP MEMORY CELL WITH PERFORMANCE IMPROVEMENT PREVENTION AND OPERATING METHOD OF MEMORY

This application is a continuation-in-part application of and claims the priority benefit of U.S. application Ser. No. 13/366,370, filed on Feb. 6, 2012, now allowed. The U.S. application Ser. No. 13/366,370 is a continuation-in-part application of and claims the priority benefit of U.S. application Ser. No. 12/633,780, filed on Dec. 8, 2009, now U.S. Pat. No. 8,174,063. The U.S. application Ser. No. 12/633,780 claims the priority benefit of U.S. provisional application No. 61/230,099, filed on Jul. 30, 2009. This application also claims the priority benefit of U.S. provisional application No. 61/857,703, filed on Jul. 24, 2013. The entirety of each of the above-mentioned patent applications is hereby incorporated by reference herein and made a part of this specification.

BACKGROUND OF THE INVENTION

1. Field of the Invention

The invention relates to a memory and an operating method thereof. More particularly, the invention relates to an antifuse OTP memory cell with performance improvement and an operating method of a memory.

2. Description of Related Art

A non-volatile memory is a type of memory that retains information it stores even when the power supply is cut off. The non-volatile memory may be classified into a read-only memory (ROM), a one-time programmable memory (OTP memory), and a rewritable memory. Moreover, the semiconductor memory technology has progressed to the point where the non-volatile memory can be implemented with the same process as a complementary metal oxide semiconductor (CMOS) device.

The OTP memory described above may be classified into a fuse type and an anti-fuse type. The fuse type OTP memory is short before being programmed and open after being programmed. On the contrary, the anti-fuse type OTP memory is open before being programmed and short after being programmed. Moreover, based on the characteristics of the metal-oxide semiconductor (MOS) device in CMOS fabrication process, the anti-fuse OTP memory is more suitable to be implemented with the CMOS fabrication process.

Moreover, the OTP memory unit forms a permanent conductive path on the ruptured gate oxide layer. Furthermore, the forming location of the permanent conductive path changes with variations in the fabrication process. Therefore, operating methods of the OTP memory unit usually result in erroneous judgments due to different forming locations of the conductive path.

SUMMARY OF THE INVENTION

The invention provides an antifuse one-time programmable (OTP) memory cell with performance improvement. The antifuse OTP memory cell with performance improvement can prevent yield loss caused by a rupture location of an antifuse layer being in a location where an antifuse gate and a substrate are in direct contact.

The invention provides an operating method of a memory. The operating method of a memory can read by using less voltage, lower PGM inhibit current, and reduce gate-induced drain leakage (GIDL) of a select gate.

The antifuse OTP memory cell with performance improvement of the invention includes a first antifuse unit and a second antifuse unit, a select transistor, and a well region. The first antifuse unit and the second antifuse unit are disposed on a substrate of a first conductivity type. The first antifuse unit includes a first antifuse layer and a first antifuse gate disposed on the substrate in sequence. The second antifuse unit includes a second antifuse layer and a second antifuse gate disposed on the substrate in sequence. The select transistor is disposed on the substrate and includes a select gate, a gate dielectric layer, a first doped region, and a second doped region. The select gate is disposed on the substrate. The gate dielectric layer is disposed between the select gate and the substrate. The first doped region and the second doped region are of a second conductivity type and are respectively disposed in the substrate at two sides of the select gate, wherein the second doped region is disposed in the substrate at the periphery of the first antifuse unit and the second antifuse unit. The well region is of the second conductivity type and is disposed in the substrate below the first antifuse unit and the second antifuse unit, and is connected to the second doped region.

In an embodiment of the invention, the thickness of each of the first antifuse layer, the second antifuse layer, and the gate dielectric layer is the same.

In an embodiment of the invention, the select transistor includes an input/output metal-oxide semiconductor (I/O MOS) transistor.

In an embodiment of the invention, the select transistor includes a core MOS transistor.

In an embodiment of the invention, the select transistor includes a double-diffused MOS (DMOS) transistor.

In an embodiment of the invention, the first conductive type is one of P-type and N-type and the second conductivity type is the other one of P-type and N-type.

In an embodiment of the invention, a portion of the well region is extended below the select gate.

In the operating method of a memory cell of the invention, the memory cell includes a select transistor disposed on a substrate, and a first antifuse unit, a second antifuse unit, and a well region respectively connected to the select transistor in series, wherein the transistor includes a select gate, a first doped region, and a second doped region, the second doped region is disposed in the substrate at the periphery of the first antifuse unit and the second antifuse unit, the first antifuse unit includes a first antifuse layer and a first antifuse gate, the second antifuse unit includes a second antifuse layer and a second antifuse gate, the well region is disposed in the substrate below the first antifuse unit and the second antifuse unit, the well region is connected to the second doped region, the conductivity type of the well region is the same as the conductivity type of the second doped region, and the method includes: during a programming operation, applying a first voltage to the select gate, applying a second voltage to the first doped region, and applying a third voltage to the first antifuse gate and the second antifuse gate, wherein the first voltage is sufficient to turn on the channel of the select transistor and the voltage difference between the second voltage and the third voltage is sufficient to rupture the first antifuse layer and the second antifuse layer.

In an embodiment of the invention, the operating method of a memory cell further includes: during a read operation, applying a fourth voltage to the select gate and applying a fifth voltage to the first antifuse gate and the second antifuse gate, wherein the fourth voltage is sufficient to turn on the channel of the select transistor, and a digital information stored in the memory cell can be determined by detecting the value of a channel current of the memory from the first doped region.

In an embodiment of the invention, the operating method of a memory cell further includes: during a read operation, applying a sixth voltage to the select gate and applying a seventh voltage to the first doped region, wherein the fourth voltage is sufficient to turn on the channel of the select transistor, and a digital information stored in the memory cell can be determined by detecting the value of a channel current of the memory cell from the first antifuse gate and the second antifuse gate.

In the operating method of a memory of the invention, the memory includes a plurality of memory cells arranged in an array, each of the memory cells including a select transistor disposed on a substrate, and a first antifuse unit, a second antifuse unit, and a well region respectively connected to the select transistor in series, wherein the select transistor includes a select gate, a first doped region, and a second doped region, the second doped region is disposed in the substrate at the periphery of the first antifuse unit and the second antifuse unit, the first antifuse unit includes a first antifuse layer and a first antifuse gate, the second antifuse unit includes a second antifuse layer and a second antifuse gate, the well region is disposed in the substrate below the first antifuse unit and the second antifuse unit, the well region is connected to the second doped region, the conductivity type of the well region is the same as the conductivity type of the second doped region, the memory further includes a plurality of select gate lines respectively connected to the select gate of each of the plurality of memory cells in the same row, a plurality of first antifuse gate lines respectively connected to the first antifuse gate of each of the plurality of memory cells in the same row, a plurality of second antifuse gate lines respectively connected the second antifuse gate of each of the plurality of memory cells in the same row, a plurality of bit lines respectively connected to the first doped region of each of the plurality of memory cells in the same column, and the method includes: during a programming operation, applying a first voltage to the select gate line coupled to the selected memory cell, applying a second voltage to the bit line coupled to the selected memory cell, and applying a third voltage to the first antifuse gate line and the second antifuse gate line coupled to the selected memory cell, wherein the first voltage is sufficient to turn on the channel of the select transistor of the selected memory cell, and the voltage difference between the second voltage and the third voltage is sufficient to rupture the first antifuse layer and the second antifuse layer of the selected memory cell.

In an embodiment of the invention, the operating method of a memory cell further includes: during a read operation, applying a fourth voltage to the select gate line coupled to the selected memory cell and applying a fifth voltage to the first antifuse gate line and the second antifuse gate line coupled to the selected memory cell, wherein the fourth voltage is sufficient to turn on the channel of the select transistor of the selected memory cell, and a digital information stored in the selected memory cell can be determined by detecting the value of a channel current of the selected memory cell from the bit line coupled to the selected memory cell.

In an embodiment of the invention, the operating method of a memory cell further includes: during a read operation, applying a sixth voltage to the select gate line coupled to the selected memory cell and applying a seventh voltage to the bit line coupled to the selected memory cell, wherein the fourth voltage is sufficient to turn on the channel of the select transistor of the selected memory cell, and a digital information stored in the selected memory cell can be determined by detecting the value of a channel current of the selected memory cell from the first antifuse gate line and the second antifuse gate line coupled to the selected memory cell.

Based on the above, in the antifuse OTP memory cell with performance improvement and the operating method of a memory of the invention, a well region is disposed in a substrate below an antifuse unit and a doped region is connected through the well region, wherein the conductivity type of each of the well region and the doped region is the same. Moreover, even if the rupture location of the antifuse layer is formed in a location without a doped region, current can still be conducted to the doped region through the well region to prevent the issue of yield loss. Accordingly, a read operation can be performed on the antifuse memory cell by using a lower voltage, PGM inhibit current can be lowered when performing a programming operation on the antifuse memory cell, and gate-induced drain leakage (GIDL) of the select gate can also be reduced during inhibit programming.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
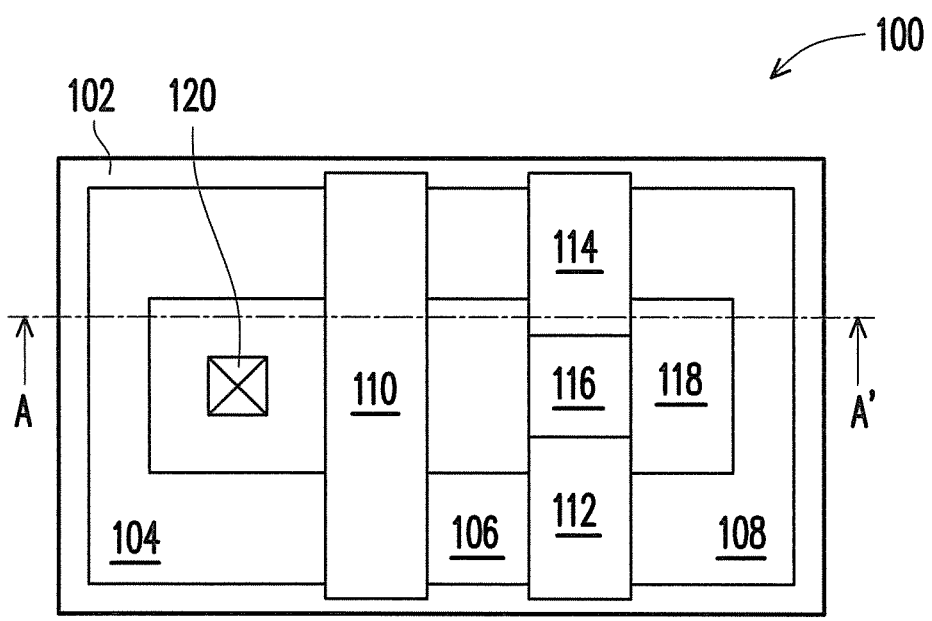
FIG. 1A is a top view of an antifuse memory cell of an embodiment of the invention.

FIG. 1A is a top view of an antifuse memory cell of an embodiment of the invention. Referring to FIG. 1A, a memory cell 100 includes a well region 102, a select gate 110, a first gate 112, a second gate 114, an insulation layer 116, a first doped region 104, a second doped region 106, a third doped region 108, and a contact plug 120. The well region 102 includes an active area 118. In particular, the insulation layer 116 can be filled between the first gate 112 and the second gate 114.

In terms of a more complete layout structure, the select gate 110 is fully formed on the active area 118. The first gate 112 and the second gate 114 are respectively partially formed on the active area 118. The first doped region 104 is disposed at a first side of the select gate 110 and the second doped region 106 is disposed at a second side of the select gate 110. From another perspective, the second doped region 106 is disposed at a first side of the first gate 112 and the second gate 114 and the third doped region is disposed at a second side of the first gate 112 and the second gate 114. In other words, the first doped region 104 and the second doped region 106 are disposed at two opposite sides of the select gate 110. Similarly, the second doped region 106 and the third doped region 108 are disposed at two opposite sides of the first gate 112 and the second gate 114. The contact plug 120 is formed on the active area 118 on the first doped region 104. Moreover, the memory cell 100 includes two memory units.

Figure 1B:
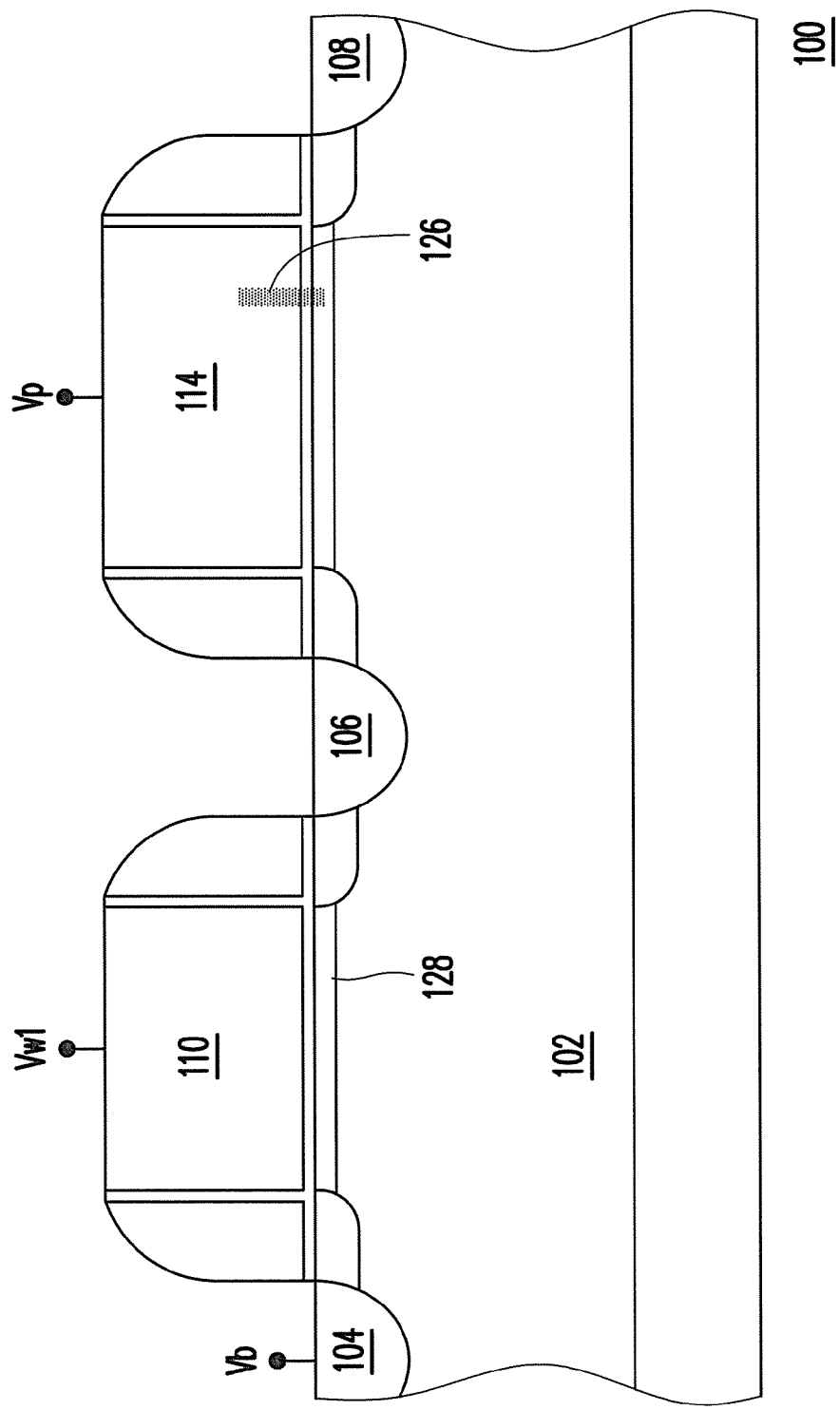
FIG. 1B illustrates a schematic cross-sectional diagram of an antifuse memory cell along the line A-A' in FIG. 1A during a programming operation.

FIG. 1B illustrates a schematic cross-sectional view of an antifuse memory cell along the line A-A' in FIG. 1A during a programming operation.

Referring to FIG. 1B, during a first period of a programming operation, a first word line voltage Vw1 is applied to the select gate 110 and a bit line voltage Vb is applied to the first doped region 104. In this way, a first channel region 128 is formed under the select gate 110 and the bit line voltage Vb is coupled to the second doped region 106 such that the voltage level of the second doped region 106 approaches the bit line voltage Vb.

Then, during the first period of the programming operation, a programming voltage Vp is applied to the first gate 114 and the second gate 112 is floated. The voltage difference between the first gate 114 and the second doped region 106 causes a first oxide layer between the first gate 114 and the well region 102 to rupture such that the first oxide layer becomes punctured and the first memory unit is programmed. In this way, a permanent conducting path 126 can be formed. In particular, the bit line voltage Vb can be, for instance, a ground voltage, and in a preferred embodiment, the programming voltage Vp is twice to 5 times as great as the first word line voltage Vw 1.

Similarly, during a second period of the programming operation, the programming voltage Vp can be provided to the second gate 112 and the first gate 114 can be floated. The differential pressure between the second gate 112 and the second doped region 106 causes a second oxide layer between the second gate 112 and the well region 102 to rupture such that the second oxide layer becomes punctured and the second memory unit is programmed.

After the memory cell 100 is programmed, the conducting path 126 is formed between the first gate 114 or the second gate 112 and the well region 102. As a result, the memory unit generates a greater current after being programmed compared to before being programmed. In other words, the state of the memory cell can be determined by reading the current of the memory unit.

Figure 1C:
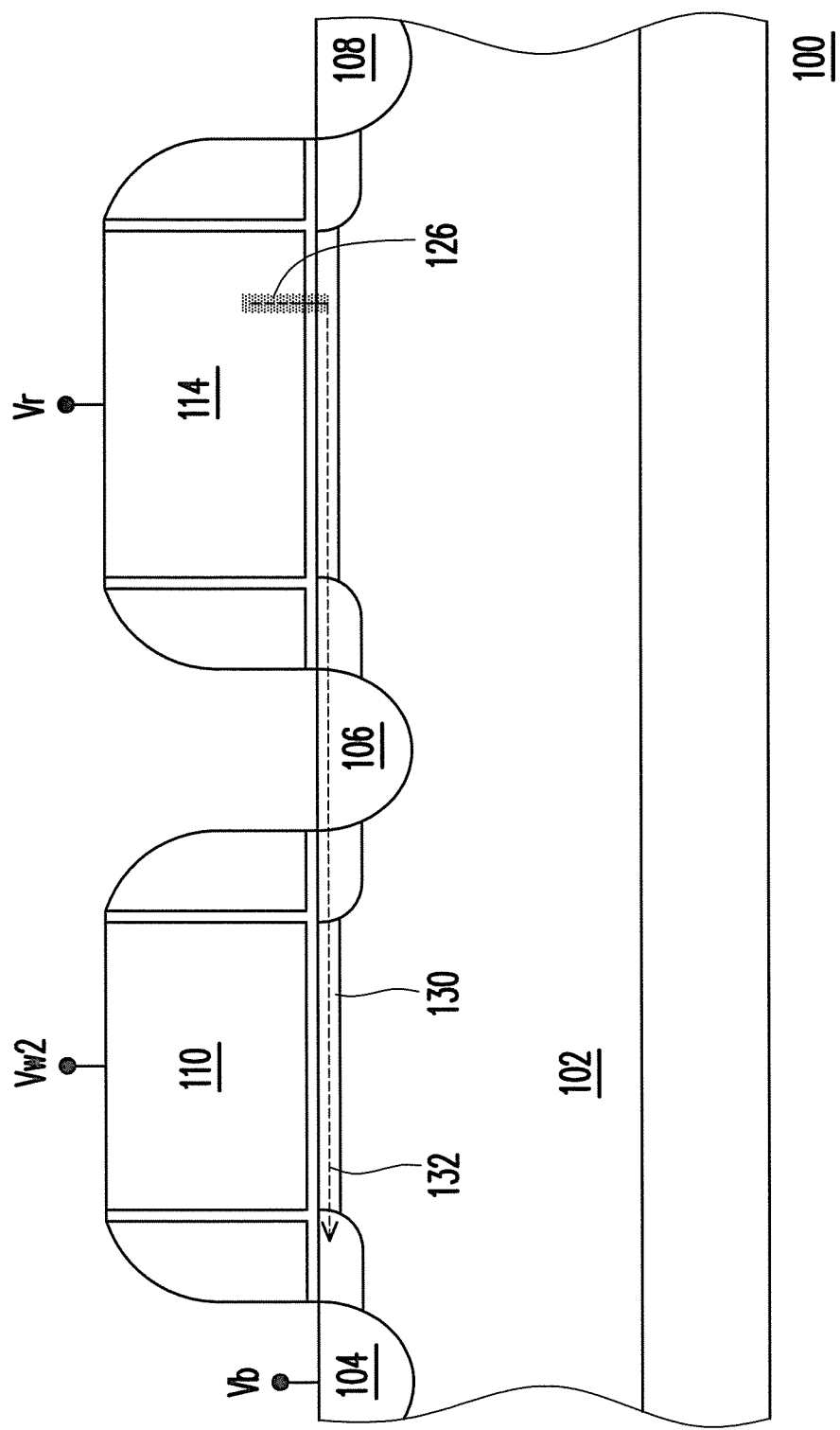
FIG. 1C illustrates a schematic cross-sectional diagram of an antifuse memory cell along the line A-A' in FIG. 1A during a read operation.

FIG. 1C illustrates a schematic cross-sectional view of an antifuse memory unit along the line A-A' in FIG. 1A during a read operation.

A read voltage Vr is provided to the first gate 114, the bit line voltage Vb is provided to the first doped region 104, and a second word line voltage Vw 2 is provided to the select gate 110. In this way, a second channel region 130 is formed below the select gate 110 and the first gate 114. Therefore, a first current 132 from the conducting path 126 can be read through the second channel region 130. In particular, the first current 132 flows from the first gate 114 to the first doped region 104. Moreover, the bit line voltage Vb can be, for instance, a ground voltage. Moreover, in a preferred embodiment, the read voltage Vr is equal to the second word line voltage Vw 2 and the programming voltage Vp can be, for instance, 2 to 5 times greater than the read voltage Vr.

When the first current 132 from the first memory unit is read, the state of the memory cell 100 can be determined according to the first current 132. Moreover, the memory cell 100 includes two memory units. As a result, the state of the memory cell 100 can also be determined through a second current from the second memory unit.

During the read operation of the second memory unit, the second current is read through a third channel region disposed below the select gate 110 and the second gate 112. For instance, the read voltage Vr can be provided to the second gate 112, the bit line voltage Vb can be provided to the first doped region 104, and the second word line voltage Vw2 can be provided to the select gate 110.

In this way, the third channel region is formed below the select gate 110 and the second gate 112. Therefore, the second current from the second memory cell can be read through the third channel region and the state of the memory cell 100 can be further determined according to the second current.

It should be mentioned that, the read method for a memory cell exemplified in FIG. 1C repeatedly determines the state of the memory cell 100 by respectively reading the current from each of the second channel region 130 and the third channel region. However, in actual application, the current from each of the second channel region and the third channel region can also be read at the same time, and the state of the memory cell 100 can be determined in one attempt.

For instance, in another embodiment of the invention, during the read operation, the bit line voltage Vb can be applied to the first doped region 104, the second word line voltage Vw2 can be applied to the select gate 110, and the read voltage Vr can be applied to the first gate 114 and the second gate 112 at the same time. In this way, the second channel region is formed below the select gate 110 and the first gate 114 and the third channel region is also formed below the select gate 110 and the second gate 112. Therefore, the current from each of the second channel region and the third channel region can be read at the same time, and the state of the memory cell 100 can be determined according to the current.

The antifuse memory cell of the invention can be used as an OTP memory cell. In the invention, one-time programming in an OTP operation is completed through the rupture of an oxide layer. Moreover, when programming, two oxide layers are ruptured sequentially or simultaneously in the operation method of the invention. As a result, two memory units can be used to store as one memory cell. In this way, the operating method of the invention can increase the success probability of the antifuse memory cell during programming and reduce misjudgment of the antifuse memory cell during reading to prevent the occurrence of high resistance after the oxide layer is ruptured.

Figure 2A:
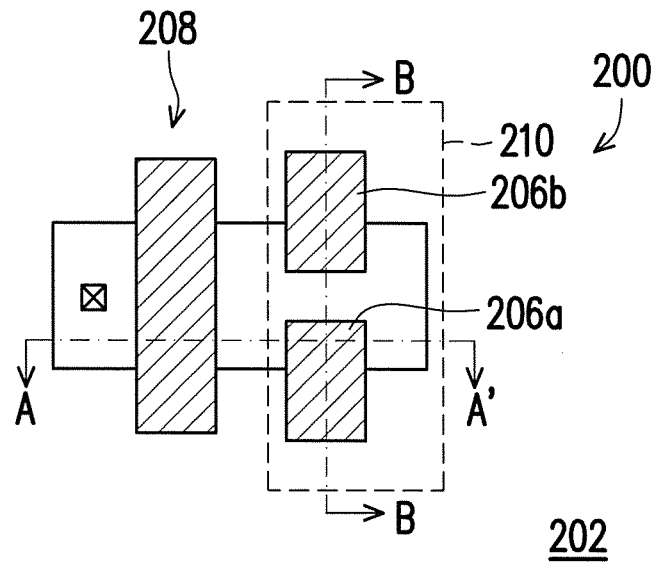
FIG. 2A illustrates a top view of a memory cell of a preferred embodiment of the invention.
Figure 2B:
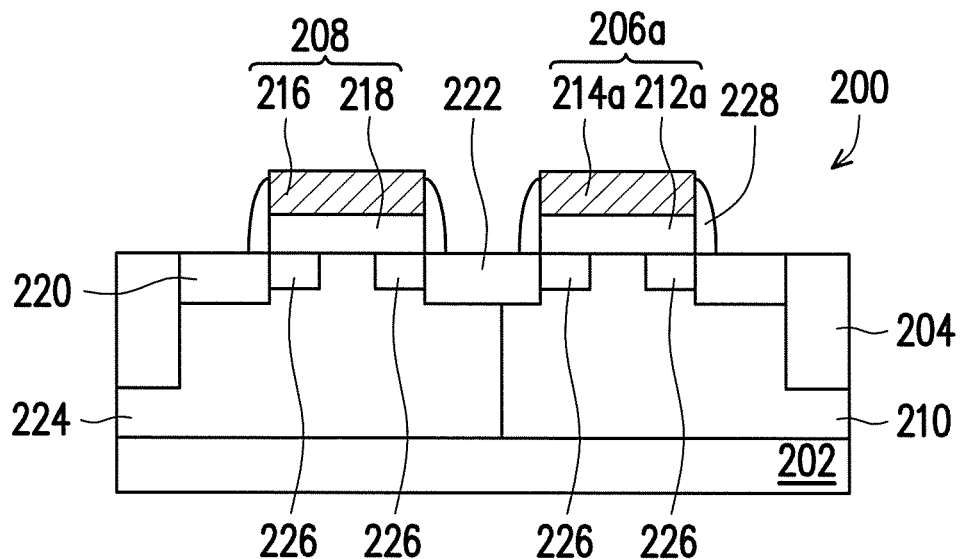
FIG. 2B illustrates a cross-sectional diagram of a memory cell in FIG. 2A along line A-A' of a preferred embodiment of the invention.
Figure 2C:
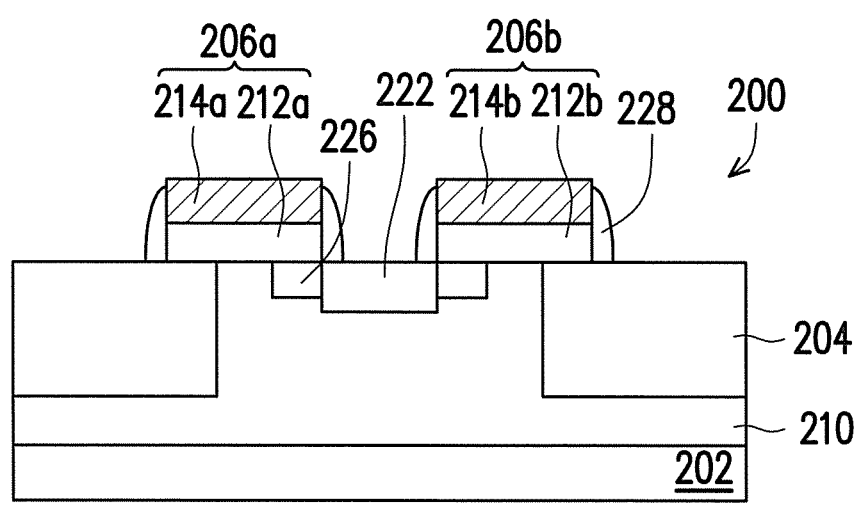
FIG. 2C illustrates a cross-sectional diagram of a memory cell in FIG. 2A along line B-B' of another preferred embodiment of the invention.

FIG. 2A illustrates a top view of a memory cell of a preferred embodiment of the invention. FIG. 2B illustrates a cross-sectional view of a memory cell in FIG. 2A along line A-A' of a preferred embodiment of the invention. FIG. 2C illustrates a cross-sectional view of a memory cell in FIG. 2A along line B-B' of another preferred embodiment of the invention.

Referring to FIG. 2A, FIG. 2B, and FIG. 2C, the antifuse memory cell 200 of the invention is, for instance, disposed on a substrate 202. The substrate 202 is, for instance, of a first conductivity type. Moreover, an isolation structure 204 is, for instance, disposed in the substrate 202 to define an active area. The isolation structure 204 is, for instance, a shallow trench isolation structure or a field oxide layer.

The antifuse memory cell 200 of the invention includes an antifuse unit 206a and an antifuse unit 206b, a select transistor 208, and a well region 210.

The antifuse unit 206a includes an antifuse layer 212a and an antifuse gate 214a disposed on the substrate 202 in sequence. The antifuse unit 206b includes an antifuse layer 212b and an antifuse gate 214b disposed on the substrate 202 in sequence.

The material of each of the antifuse layer 212a and the antifuse layer 212b is, for instance, silicon oxide or other insulation layers (for instance, an oxide layer with a high dielectric value such as $HfO_2$ or $Al_2O_3$) capable of forming a gate oxide layer. The programming operation is performed by rupturing the antifuse layer 212a and the antifuse layer 212b below the antifuse gate 214a and the antifuse gate 214b.

The select transistor 208 is disposed on the substrate 202 and includes a select gate 216, a gate dielectric layer 218, a doped region 220, and a doped region 222. The select gate 216 is, for instance, disposed on the substrate 202.

The gate dielectric layer 218 is, for instance, disposed between the select gate 216 and the substrate 202. The material of the gate dielectric layer 218 is, for instance, silicon oxide or other insulation layers (for instance, an oxide layer with a high dielectric value such as $HfO_2$ or $Al_2O_3$) capable of forming a gate oxide layer. The thickness of each of the antifuse layer 212a, the antifuse layer 212b, and the gate dielectric layer 218 is, for instance, the same or different.

The doped region 220 and the doped region 222 are of a second conductivity type and are respectively disposed in the substrate 202 on two sides of the select gate 216. In particular, the doped region 222 is disposed in the substrate 202 at the periphery of the antifuse unit 206a and the antifuse unit 206b. A channel region is, for instance, defined between the doped region 220 and the doped region 222.

The well region 210 is of the second conductivity type, is disposed in the substrate 202 below the antifuse unit 206a and the antifuse unit 206b, and is connected to the doped region 222.

In the antifuse memory cell of the invention, a well region 224 of the first conductivity type can also be disposed according to need. The doped region 220 is, for instance, disposed in the well region 224.

In the antifuse memory cell of the invention, a doped region 226 of the second conductivity type can also be disposed according to need. The doped region 226 is a source/drain extension region, a double diffusion region, or a lightly doped region.

In the antifuse memory cell of the invention, a spacer 228 can also be disposed according to need. The spacer 228 is disposed on a sidewall of each of the select gate 216, the antifuse gate 214a, and the antifuse gate 214b.

In the embodiments above, if the first conductivity type is P-type, then the second conductivity type is N-type, and if the first conductivity type is N-type, then the second conductivity type is P-type.

In the antifuse memory cell of the invention, the select transistor is, for instance, an input/output metal-oxide semiconductor (I/O MOS) transistor, a core MOS transistor, or a double-diffused MOS (DMOS) transistor.

Using a 40 nanometer process as an example, when the select transistor is a core MOS transistor or a DMOS transistor, the thickness of the gate dielectric layer 218 is, for instance, 20 Å-30 Å, and the doping concentration of the doped region 226 is, for instance, $5*10^{13}-1*10^{15}$ (1/cm$^2$). When the select transistor is an I/O MOS transistor, the thickness of the gate dielectric layer 218 is, for instance, 50 Å-70 Å, and the doping concentration of the doped region 226 is, for instance, $1*10^{12}-4*10^{13}$ (1/cm$^2$).

Figure 3A:
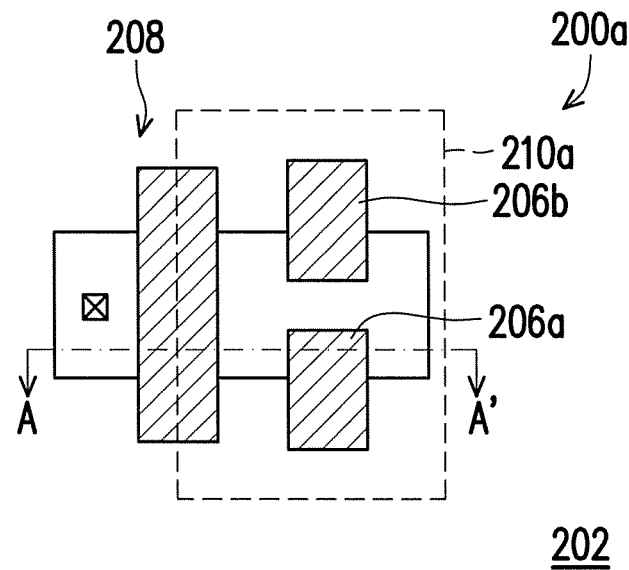
FIG. 3A illustrates a top view of an antifuse memory cell of another embodiment of the invention.
Figure 3B:
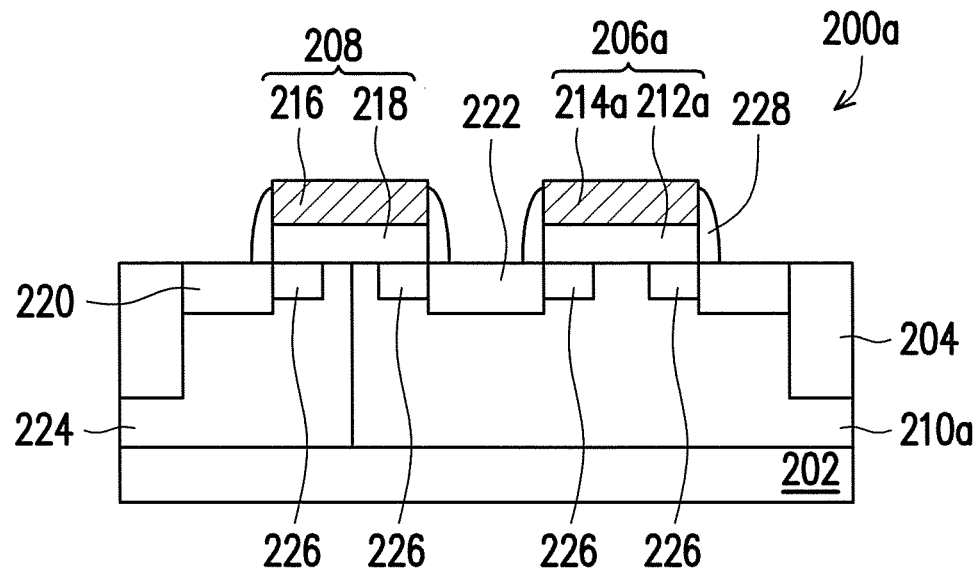
FIG. 3B illustrates a cross-sectional diagram of a memory cell in FIG. 3A along line A-A' of a preferred embodiment of the invention.

FIG. 3A illustrates a cross-sectional view of an antifuse memory cell of another embodiment of the invention. FIG. 3B illustrates a cross-sectional view of a memory cell in FIG. 3A along line A-A' of a preferred embodiment of the invention.

In the present embodiment, components that are the same as the antifuse memory cell shown in FIGS. 2A-2C are given the same reference numerals and are not repeated herein.

Referring to FIG. 3A-FIG. 3B, in comparison to the antifuse memory cell shown in FIGS. 2A-2C, a well region 210a of the antifuse memory cell of the present embodiment is disposed in the substrate 202 below the antifuse unit 206a and the antifuse unit 206b, and a portion of the well region 210a is extended below the select gate.

Figure 4A:
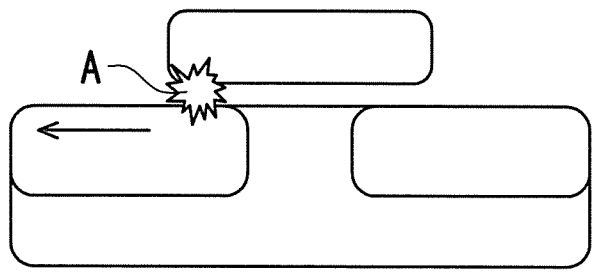
FIG. 4A and FIG. 4B illustrate cross-sectional diagrams of an antifuse unit.
Figure 4B:
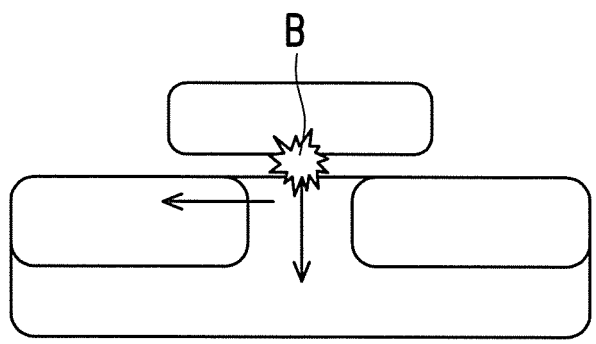

FIG. 4A and FIG. 4B illustrate cross-sectional views of an antifuse unit.

When programming the antifuse memory cell, the antifuse layer is ruptured by the voltage difference between the voltage applied to the antifuse gate and the voltage applied to the doped region (bit line). As a result, a conducting path is formed between the antifuse gate and the substrate, thereby programming the memory cell. However, the rupture location of the antifuse layer is difficult to control during the programming operation. As shown in FIG. 4A, a rupture location A causes the antifuse gate to be electrically connected to the doped region (connected to the bit line) after the antifuse layer is ruptured. As a result, during a read operation, a lower read voltage can be used for reading. As shown in FIG. 4B, a rupture location B causes the antifuse gate to be connected to the substrate after the antifuse layer is ruptured. As a result, during a read operation, since a leakage current exists between the antifuse gate and the substrate, yield loss is therefore inevitable. As a result, the issue of yield loss caused by the rupture location of the antifuse layer causes the generation of excessive variation in current uniformity to the memory when reading the memory cell, thereby reducing the controllability, the yield, and the reliability of the memory.

However, in the antifuse memory cell of the invention, as shown in FIG. 2B and FIG. 3B, the doped region 222 is connected through the well region 210 (well region 210a). In particular, the conductivity type of each of the well region 210 (well region 210a) and the doped region 222 is the same. Moreover, even if the rupture location of the antifuse layer is formed in a location away from the doped region 222, current can still be conducted to the doped region 222 through the well region 210 (well region 210a) to prevent the issue of yield loss. When a read operation is performed on the antifuse memory cell, a lower voltage can also be used for reading.

Moreover, since the well region 210 (well region 210a) is disposed in the substrate 202 below the antifuse unit 206a and the antifuse unit 206b, the antifuse gate is not directly connected to the substrate after the antifuse layer is ruptured. As a result, when performing a programming operation on the antifuse memory cell, PGM inhibit current can be reduced.

Moreover, when the select transistor is an I/O MOS transistor, the thickness of the gate dielectric layer 218 is, for instance, 50 Å-70 Å, and the thickness of the gate dielectric layer 218 is greater than the thickness of each of the antifuse layer 212a and the antifuse layer 212b. As a result, GIDL of the select gate can also be reduced during inhibit programming.

Moreover, when the select transistor is a DMOS transistor and the well region 210a is further extended below the select gate from the antifuse unit 206a and the antifuse unit 206b (as shown in FIG. 3B), hot carriers generated by a large lateral electric field between the antifuse gate 214a, the antifuse gate 214b, and the select gate can be reduced. In this way, GIDL of the select gate can also be reduced during programming and inhibit programming.

Moreover, when the select transistor is an I/O MOS transistor and the well region 210a is further extended below the select gate from the antifuse unit 206a and the antifuse unit 206b (as shown in FIG. 3B), GIDL of the select gate can also be reduced during inhibit programming.

Figure 5:
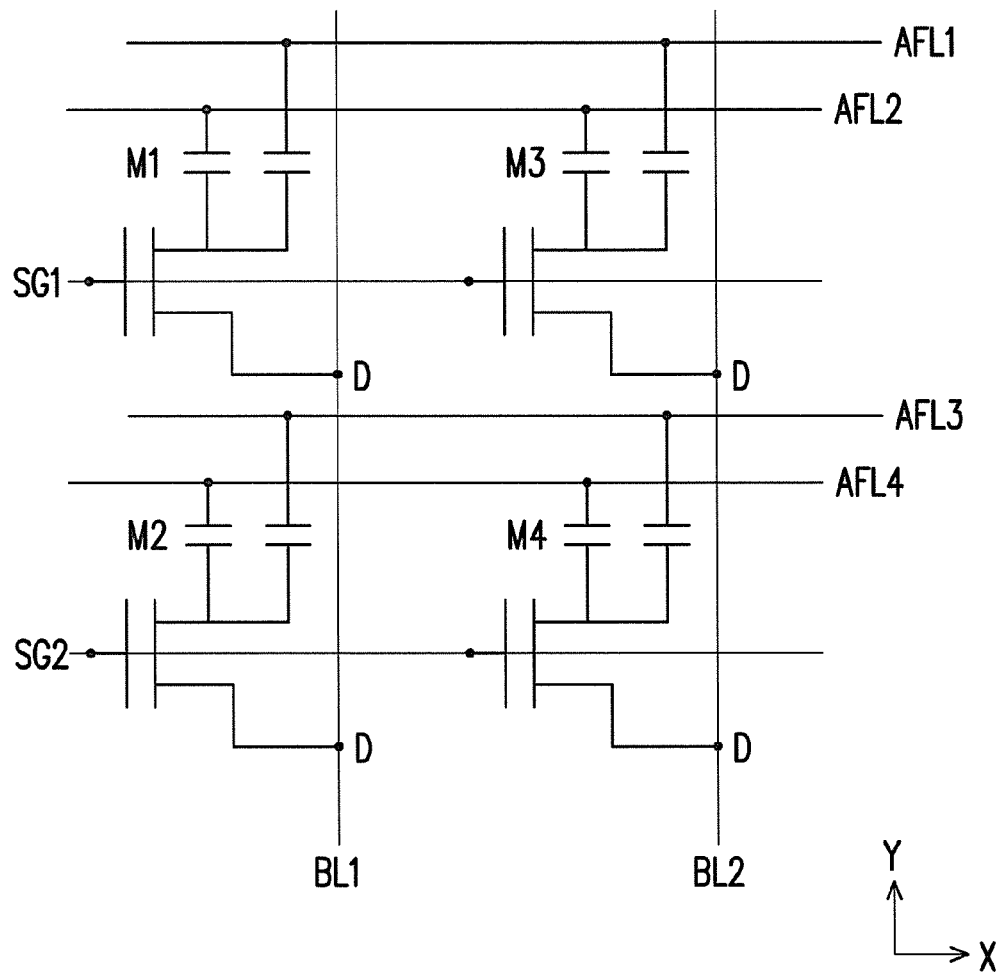
FIG. 5 illustrates an electrical schematic diagram of an antifuse memory cell array of a preferred embodiment of the invention.

FIG. 5 illustrates an electrical schematic of an antifuse memory cell array of a preferred embodiment of the invention.

Referring to FIG. 5, the antifuse memory of the invention is, for instance, formed by a plurality of memory cell arrays. The memory cell arrays are described below. In the present embodiment, a memory cell array is exemplified as composing 2*2 memory cells. However, the number of memory cells composing the memory cell array can be adjusted according to actual need, and the memory cell array can be composed of, for instance, 64, 256, or 512 memory cells. In FIG. 5, the X direction is defined as the row direction and the Y direction is defined as the column direction.

The memory cell array includes a plurality of memory cells M1-M4, a plurality of select gate lines SG1-SG2, a plurality of antifuse gate lines AFL1-AFL 4, and a plurality of bit lines BL1-BL2.

Each of the memory cells M1-M4 has the structure of FIG. 2A-FIG. 2C (or FIG. 3A-FIG. 3B) and is not repeated herein.

The plurality of select gate lines SG1-SG2 is disposed on the substrate in parallel and is extended in the row direction (X direction). The select gate lines SG1-SG2 are respectively connected to the select gate of each of the memory cells in the same row. For instance, each of the select gate lines SG1 is connected to the select gate of each of the plurality of memory cells M1-M3, and each of the select gate lines SG2 is connected to the select gate of each of the plurality of memory cells M2 and M4.

The plurality of antifuse gate lines AFL1-AFL4 is disposed on the substrate in parallel and is extended in the row direction (X direction). The antifuse gate lines AFL1-AFL4 are respectively connected to the antifuse gate of each of the memory cells in the same row. For instance, each of the antifuse gate lines AFL1 is connected to a first antifuse gate (such as the antifuse gate 214a in FIG. 2C) of each of the plurality of memory cells M1 and M3, each of the antifuse gate lines AFL2 is connected to a second antifuse gate (such as the antifuse gate 214b in FIG. 2C) of each of the plurality of memory cells M1 and M3, each of the antifuse gate lines AFL3 is connected to a first antifuse gate of each of the plurality of memory cells M2 and M4, and each of the antifuse gate lines AF4 is connected to a second antifuse gate of each of the plurality of memory cells M2 and M4.

The plurality of bit lines BL1-BL2 is disposed on the substrate in parallel and is extended in the column direction (Y direction). The bit lines BL1-BL2 are respectively connected to a doped region of each of the memory cells in the same column. For instance, each of the bit lines BL1 is connected to the doped region of each of the plurality of memory cells M1 and M2 (such as the doped region 220 in FIG. 2B and FIG. 3B), and each of the bit lines BL2 is connected to the doped region of each of the plurality of memory cells M3-M4.

Next, the operating method of an antifuse memory of the invention is described. In particular, the operating method of an antifuse memory includes operating modes such as programming and data reading. Only one preferred embodiment is provided in the following to illustrate the operating method of an antifuse memory of the invention. However, the operating method of an antifuse memory of the invention is not limited thereto. The memory cell M1 in the figures is used as an example in the following description.

Figure 6A:
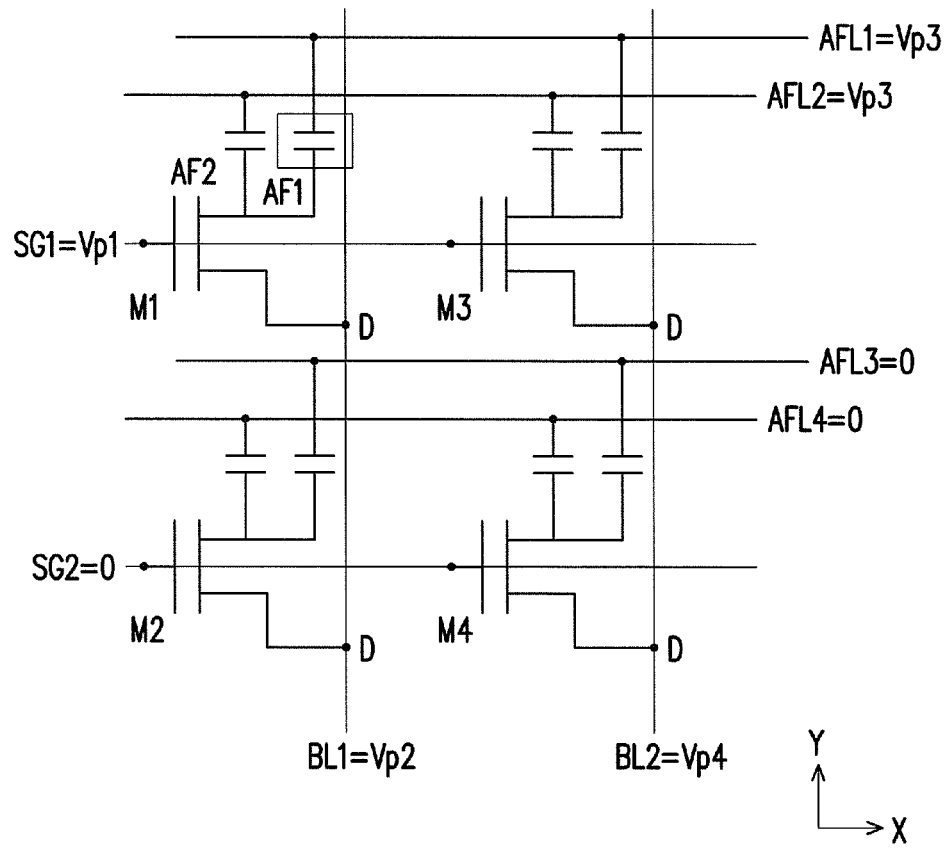
FIG. 6A illustrates a schematic diagram of an embodiment of performing a programming operation on a memory array.
Figure 6B:
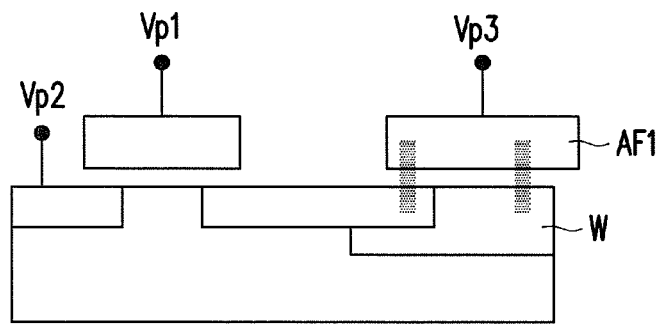
FIG. 6B illustrates a schematic cross-sectional diagram of a selected memory cell M1 during a programming operation.

FIG. 6A illustrates a schematic diagram of an embodiment of performing a programming operation on a memory array. FIG. 6B illustrates a schematic cross-sectional view of a selected memory cell M1 during a programming operation.

Referring to FIG. 6A and FIG. 6B, when a programming operation is performed on the selected memory cell M1, a voltage Vp1 is applied to the select gate line SG1 coupled to the selected memory cell M1, a voltage Vp2 is applied to the bit line BL1 coupled to the selected memory cell M1, and a voltage Vp3 is applied to the antifuse gate lines AFL1 and AFL2 coupled to the selected memory cell M1. A voltage Vp4 is applied to the bit lines BL2. In particular, the voltage Vp1 is sufficient to turn on the channel of the select transistor. The voltage difference between the voltage Vp2 and the voltage Vp3 is sufficient to rupture the antifuse layer below the antifuse gate of the selected memory cell M1 and form a conducting path. The voltage difference between the voltage Vp2 and the voltage Vp4 is not sufficient to rupture the antifuse layer below the antifuse gate of each of the non-selected memory cells.

As shown in FIG. 6A, when programming the selected memory cell M1, the voltage Vp1 applied to the select gate line SG1 turns on the channel of the select transistor. Therefore, the voltage Vp2 applied to the bit line BL1 reaches below the antifuse gate through the channel of the select transistor. Then, the voltage difference between the voltage Vp3 applied to the antifuse gate lines AFL1 and AFL2 and the voltage Vp2 applied to the bit line BL1 ruptures the antifuse layer, thereby programming the selected memory cell M1.

In the present embodiment, the voltage Vp1 is, for instance, around 0.7-3.5 volts, the voltage Vp2 is, for instance, around 0 volts, the voltage Vp3 is, for instance, around 4.5-12 volts, and the voltage Vp4 is, for instance, around 0.7-3.5 volts.

The present embodiment is exemplified by applying the voltage Vp3 to the antifuse gate lines AFL1 and AFL2 at the same time such that the antifuse layer of each of the antifuse unit AF1 and the antifuse unit AF2 of the memory cell M1 is ruptured at the same time. Of course, a different voltage can also be applied to the antifuse gate line AFL1 and the antifuse gate line AFL2 such that the antifuse layer of the antifuse unit AF1 or the antifuse unit AF2 is selectively ruptured.

When performing the above programming operation, for the non-selected memory cell M3 sharing the select gate line SG1, the antifuse gate line AFL1, and the antifuse gate line AFL2 with the selected memory cell M1, since the voltage difference between the voltage Vp4 applied to the bit line BL2 coupled to the non-selected memory cell M3 and the voltage Vp3 applied to the antifuse gate line AFL1 and the antifuse gate line AFL2 is not sufficient to rupture the antifuse layer of the non-selected memory cell M3, the programming of the non-selected memory cell M3 can be inhibited.

When performing the above programming operation, for the non-selected memory cell M2 sharing the bit line BL1 with the selected memory cell M1, the voltage Vp2 is applied to the bit line BL1 coupled to the non-selected memory cell M2, since the voltage applied to each of the select gate line SG2, the antifuse gate line AFL3, and the antifuse gate line AFL4 coupled to the non-selected memory cell M2 is a ground voltage (0 volts), the channel region of the select gate of each of the non-selected memory cell M2 is in a turn off state. Since a voltage difference does not exist between the antifuse gate of the non-selected memory cell M2 and the substrate, the antifuse layer of the non-selected memory cell M2 is not ruptured. That is, the non-selected memory cell M2 is not programmed.

When performing the above programming operation, for the non-selected memory cell M4, the voltage Vp4 is applied to the bit line BL2 coupled to the non-selected memory cell M4, since the voltage applied to the select gate line SG2, the antifuse gate line AFL3, and the antifuse gate line AFL4 coupled to the non-selected memory cell M4 is a ground voltage (0 volts), the channel region of the select gate of each of the non-selected memory cell M4 is in a turn off state. Since a voltage difference does not exist between the antifuse gate AF of the non-selected memory cell M4 and the substrate, the antifuse layer of the non-selected memory cell M4 is not ruptured. That is, the non-selected memory cell M4 is not programmed.

During the programming operation of the antifuse memory in the above embodiments, although the programming operation is performed in a unit of a single memory cell in the memory cell array, the programming operation of the antifuse memory of the invention can also program in units of bytes, sectors, or blocks by controlling each of the select gate lines, each of the bit lines and each of the antifuse gate line.

As shown in FIG. 6B, since a well region W is disposed in the substrate below the antifuse unit AF1, the antifuse gate is not directly connected to the substrate after the antifuse layer is ruptured. As a result, when performing a programming operation on the antifuse memory cell, PGM inhibit current can be reduced.

Figure 7A:
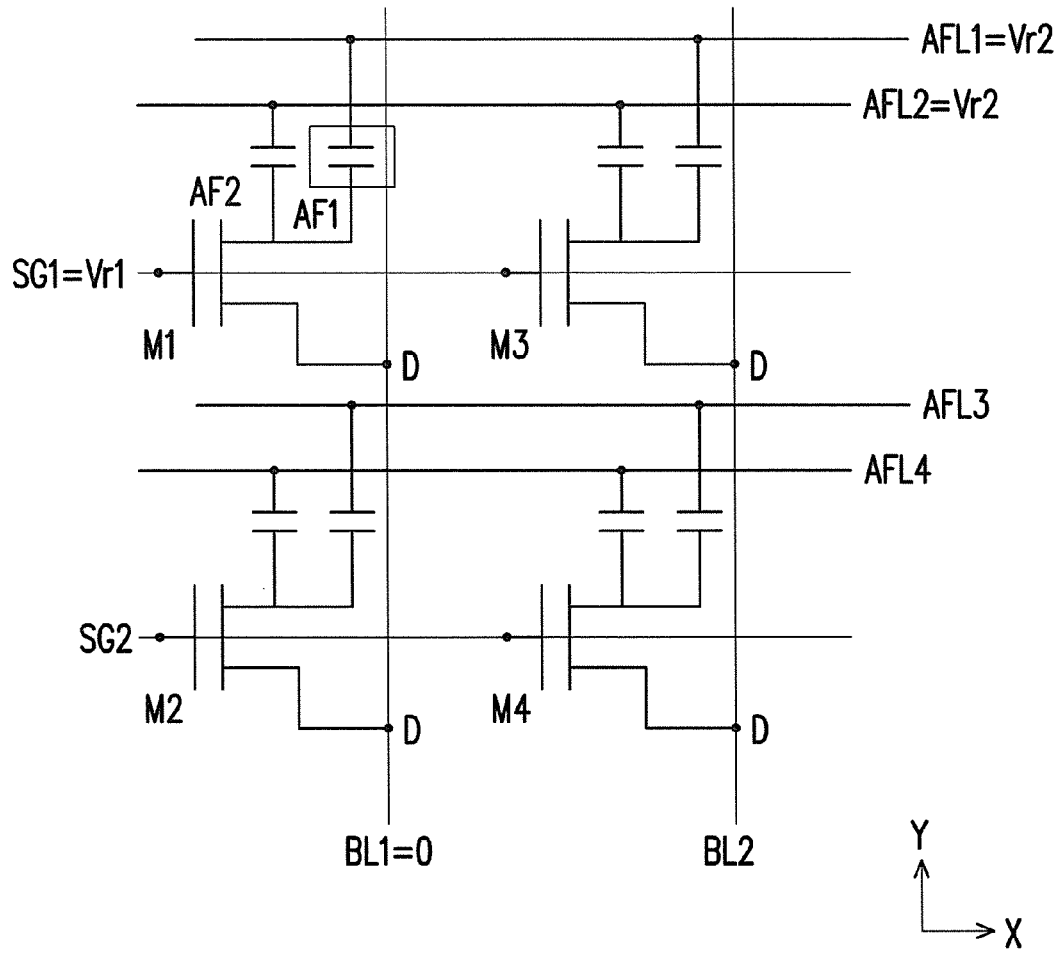
FIG. 7A illustrates a schematic diagram of an embodiment of performing a read operation on a memory array.
Figure 7B:
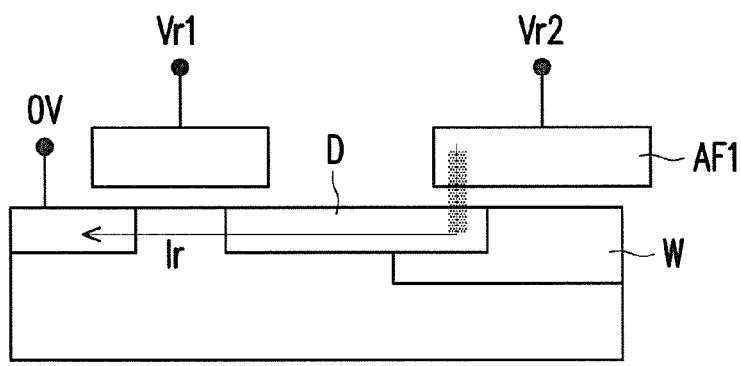
FIG. 7B illustrates a schematic cross-sectional diagram of a selected memory cell M1 during a read operation.

FIG. 7A illustrates a schematic diagram of an embodiment of performing a read operation on a memory array. FIG. 7B illustrates a schematic cross-sectional view of a selected memory cell M1 during a read operation.

Referring to FIG. 7A and FIG. 7B, when a read operation is performed on the selected memory cell M1, a voltage Vr1 is applied to the select gate line SG1 coupled to the selected memory cell M1, a voltage Vr2 is applied to the antifuse gate line AFL1 and the antifuse gate line AFL2 coupled to the selected memory cell M1, and a voltage of 0 is applied to the bit line BL1 coupled to the selected memory cell M1. The voltage Vr1 is sufficient to turn on the channel of the select transistor, and a digital information stored in the memory cell M1 can be determined by detecting the value of a channel current Ir of the memory from the bit line BL1 (doped region).

In the present embodiment, the voltage Vr1 is, for instance, around 0.7-3.5 volts and the voltage Vr2 is, for instance, around 0.7-3.5 volts.

Figure 8A:
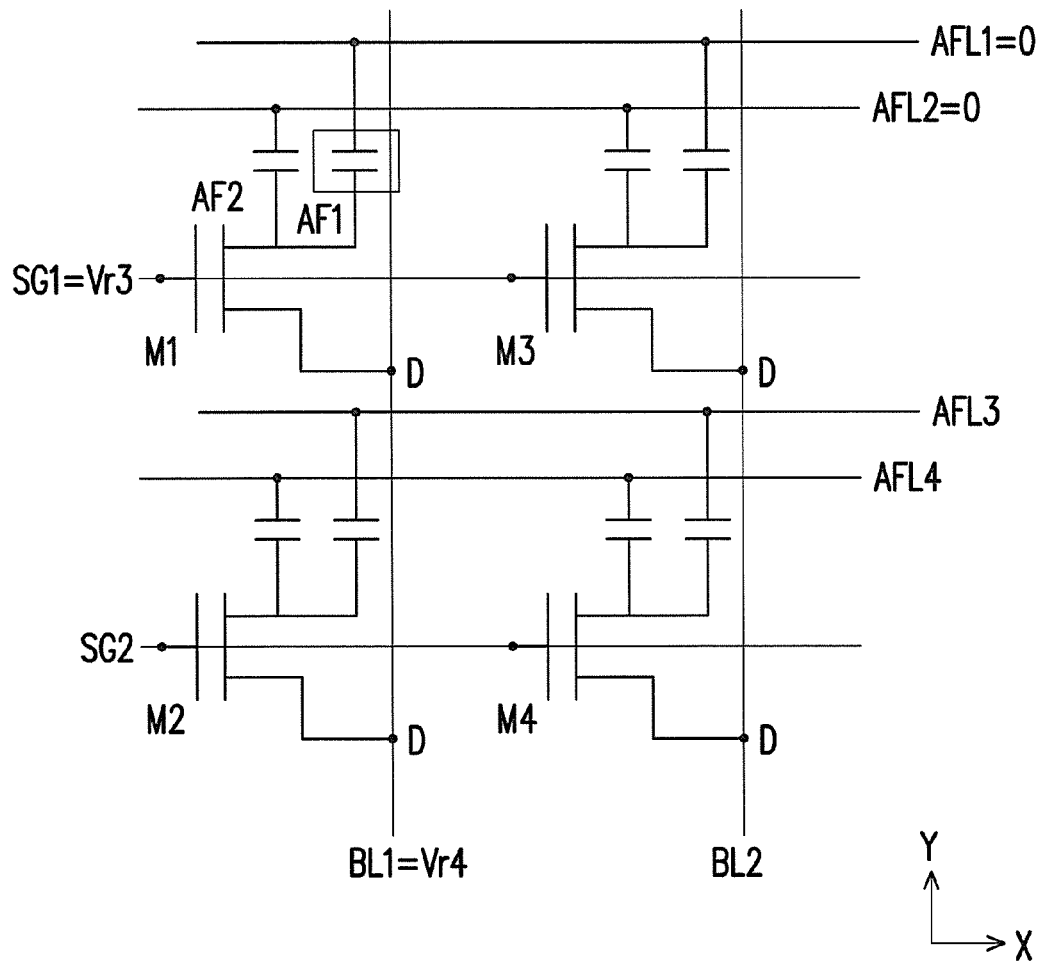
FIG. 8A illustrates a schematic diagram of an embodiment of performing a read operation on a memory array.
Figure 8B:
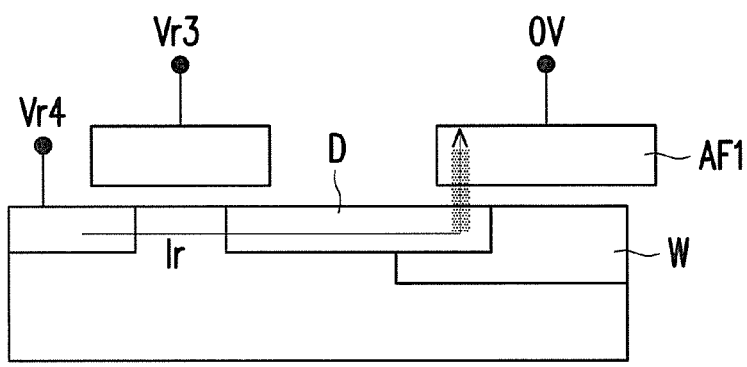
FIG. 8B illustrates a schematic cross-sectional diagram of a selected memory cell M1 during a read operation.

FIG. 8A illustrates a schematic diagram of an embodiment of performing a read operation on a memory array. FIG. 8B illustrates a schematic cross-sectional view of a selected memory cell M1 during a read operation.

Referring to FIG. 8A and FIG. 8B, when a read operation is performed on the selected memory cell M1, a voltage Vr3 is applied to the select gate line SG1 coupled to the selected memory cell M1, a ground voltage (0 volts) is applied to the antifuse gate line AFL1 and the antifuse gate line AFL2 coupled to the selected memory cell M1, and a voltage Vr4 is applied to the bit line BL1 coupled to the selected memory cell M1. The voltage Vr3 is sufficient to turn on the channel of the select transistor, and a digital information stored in the memory cell M1 can be determined by detecting the value of the channel current Ir of the memory from the antifuse gate line AFL1 and the antifuse gate line AFL2.

In the present embodiment, the voltage Vr3 is, for instance, around 0.7-3.5 volts and the voltage Vr4 is, for instance, around 0.7-3.5 volts.

As shown in FIG. 7B and FIG. 8B, the doped region D is connected through the well region W. In particular, the conductivity type of each of the well region W and the doped region D is the same. Moreover, even if the rupture location of the antifuse layer is formed in a location without the doped region D, current can still be conducted to the doped region D through the well region W to prevent the issue of yield loss. When a read operation is performed on the antifuse memory cell, a lower voltage can also be used for reading. Moreover, the antifuse memory cell of the invention can be read forward (FIG. 7A and FIG. 7B) and in reverse (FIG. 8A and FIG. 8B).

Based on the above, in the antifuse OTP memory cell with performance improvement and the operating method of a memory of the invention, a well region is disposed in a substrate below an antifuse unit and a doped region is connected through the well region. In particular, the conductivity type of each of the well region and the doped region is the same. Moreover, even if the rupture location of the antifuse layer is formed in a location without a doped region, current can still be conducted to the doped region through the well region to prevent the issue of yield loss. When a read operation is performed on the antifuse memory cell, a lower voltage can also be used for reading. The well region is used to prevent the antifuse gate from being directly connected to the substrate after the antifuse layer is ruptured. As a result, when performing a programming operation on the antifuse memory cell, PGM inhibit current can be reduced. GIDL of the select gate can also be reduced during inhibit programming.

Although the invention has been described with reference to the above embodiments, it will be apparent to one of the ordinary skill in the art that modifications and variations to the described embodiments may be made without departing from the spirit and scope of the invention. Accordingly, the scope of the invention will be defined by the attached claims not by the above detailed descriptions.

What is claimed is:

1. An antifuse one-time programmable (OTP) memory cell with performance improvement, comprising:
   a first antifuse unit and a second antifuse unit disposed on a substrate of a first conductivity type,
      the first antifuse unit comprising a first antifuse layer and a first antifuse gate disposed on the substrate in sequence; and
      the second antifuse unit comprising a second antifuse layer and a second antifuse gate disposed on the substrate in sequence;
   a select transistor disposed on the substrate, comprising:
      a select gate disposed on the substrate;
      a gate dielectric layer disposed between the select gate and the substrate;
      a first doped region and a second doped region of a second conductivity type respectively disposed in the substrate at two sides of the select gate, wherein the second doped region is disposed in the substrate at a periphery of the first antifuse unit and the second antifuse unit; and a well region of the second conductivity type disposed in the substrate below the first antifuse unit and the second antifuse unit and connected to the second doped region.

2. The antifuse OTP memory cell with performance improvement of claim 1, wherein a thickness of each of the first antifuse layer, the second antifuse layer, and the gate dielectric layer is the same.

3. The antifuse OTP memory cell with performance improvement of claim 1, wherein the select transistor comprises an input/output metal-oxide semiconductor (I/O MOS) transistor.

4. The antifuse OTP memory cell with performance improvement of claim 1, wherein the select transistor comprises a core MOS transistor.

5. The antifuse OTP memory cell with performance improvement of claim 1, wherein the select transistor comprises a double-diffused MOS (DMOS) transistor.

6. The antifuse OTP memory cell with performance improvement of claim 1, wherein the first conductivity type is one of P-type and N-type and the second conductivity is the other one of P-type and N-type.

7. The antifuse OTP memory cell with performance improvement of claim 1, wherein a portion of the well region is extended below the select gate.

8. The antifuse OTP memory cell with performance improvement of claim 7, wherein a thickness of each of the first antifuse layer, the second antifuse layer, and the gate dielectric layer is the same.

9. The antifuse OTP memory cell with performance improvement of claim 7, wherein the select transistor comprises an I/O MOS transistor.

10. The antifuse OTP memory cell with performance improvement of claim 7, wherein the select transistor comprises a core MOS transistor.

11. The antifuse OTP memory cell with performance improvement of claim 7, wherein the select transistor comprises a DMOS transistor.

12. An operating method of a memory cell, the memory cell comprising a select transistor disposed on a substrate, a first antifuse unit and a second antifuse unit respectively connected to the select transistor in series, and a well region, wherein the select transistor comprises a select gate, a first doped region, and a second doped region, the second doped region is disposed in the substrate at a periphery of the first antifuse unit and the second antifuse unit, the first antifuse unit comprises a first antifuse layer and a first antifuse gate, the second antifuse unit comprises a second antifuse layer and a second antifuse gate, the well region is disposed in the substrate below the first antifuse unit and the second antifuse unit, the well region is connected to the second doped region, a conductivity type of the well region is the same as a conductivity type of the second doped region, and the method comprises:

during a programming operation, applying a first voltage to the select gate, applying a second voltage to the first doped region, and applying a third voltage to the first antifuse gate and the second antifuse gate, wherein the first voltage is sufficient to turn on a channel of the select transistor, and a voltage difference between the second voltage and the third voltage is sufficient to rupture the first antifuse layer and the second antifuse layer.

13. The method of claim 12, further comprising:
during a read operation, applying a fourth voltage to the select gate and applying a fifth voltage to the first antifuse gate and the second antifuse gate, wherein the fourth voltage is sufficient to turn on the channel of the select transistor, and a digital information stored in the memory cell can be determined by detecting a value of a channel current of a memory from the first doped region.

14. The method of claim 12, further comprising:
during a read operation, applying a sixth voltage to the select gate and applying a seventh voltage to the first doped region, wherein the sixth voltage is sufficient to turn on the channel of the select transistor, and a digital information stored in the memory cell can be determined by detecting a value of a channel current of the memory cell from the first antifuse gate and the second antifuse gate.

15. An operating method of a memory, the memory comprising a plurality of memory cells arranged in an array, each of the memory cells comprising a select transistor disposed on a substrate, a first antifuse unit and a second antifuse unit respectively connected to the select transistor in series, and a well region, wherein the select transistor comprises a select gate, a first doped region, and a second doped region, the second doped region is disposed in the substrate at a periphery of the first antifuse unit and the second antifuse unit, the first antifuse unit comprises a first antifuse layer and a first antifuse gate, the second antifuse unit comprises a second antifuse layer and a second antifuse gate, the well region is disposed in the substrate below the first antifuse unit and the second antifuse unit, the well region is connected to the second doped region, a conductivity type of the well region is the same as a conductivity type of the second doped region, the memory further comprises a plurality of select gate lines respectively connected to the select gate of each of the memory cells in a same row, a plurality of first antifuse gate lines respectively connected to the first antifuse gate of each of the memory cells in the same row, a plurality of second antifuse gate lines respectively connected the second antifuse gate of each of the memory cells in the same row, a plurality of bit lines respectively connected to the first doped region of each of the memory cells in a same column, and the method comprises:

during a programming operation, applying a first voltage to a select gate line coupled to a selected memory cell, applying a second voltage to a bit line coupled to the selected memory cell, and applying a third voltage to a first antifuse gate line and a second antifuse gate line coupled to the selected memory cell, wherein the first voltage is sufficient to turn on a channel of the select transistor of the selected memory cell, and a voltage difference between the second voltage and the third voltage is sufficient to rupture the first antifuse layer and the second antifuse layer of the selected memory cell.

16. The method of claim 15, further comprising:
during a read operation, applying a fourth voltage to the select gate line coupled to the selected memory cell and applying a fifth voltage to the first antifuse gate line and the second antifuse gate line coupled to the selected memory cell, wherein the fourth voltage is sufficient to turn on the channel of the select transistor of the selected memory cell, and a digital information stored in the selected memory cell can be determined by detecting a value of a channel current of the selected memory cell from the bit line coupled to the selected memory cell.

17. The method of claim 15, further comprising:
during a read operation, applying a sixth voltage to the select gate line coupled to the selected memory cell and applying a seventh voltage to the bit line coupled to the selected memory cell, wherein the sixth voltage is sufficient to turn on the channel of the select transistor of the selected memory cell, and a digital information stored in the selected memory cell can be determined by detecting a value of a channel current of the selected memory cell from the first antifuse gate line and the second antifuse gate line coupled to the selected memory cell.

* * * * *